US009069081B2

(12) United States Patent  (10) Patent No.: US 9,069,081 B2
Campbell et al.  (45) Date of Patent: Jun. 30, 2015

(54) RADIATION MONITORING DEVICE

(75) Inventors: Michael Campbell, Geneva (CH);
Xavier Llopart Cudie, Sergy (FR);
Lukas Tlustos, Geneva (CH); Winnie Sze-Wing Wong, Geneva (CH); Rafael Ballabriga Suñe, Thoiry (FR); Gisela Anton, Erlangen (DE); Thilo Michel, Nürnberg (DE); Michael Böhnel, Karlshuld (DE); Karl L. Schwartz, Pyrbaum (DE); Uwe Mollenhauer, Schwarzenbruck (DE); Ernst Fritsch, Leutershausen (DE)

(73) Assignees: European Organization For Nuclear Research (CERN), Geneva (CH);
Friedrich-Alexander-Universitat Erlangen-Nurnberg, Erlangen (DE);
Ion Beam Applications S.A., Louvain-la-Neuve (BE)

(*) Notice: Subject to any disclaimer, the term of this patent is extended or adjusted under 35 U.S.C. 154(b) by 728 days.

(21) Appl. No.: 12/672,758

(22) PCT Filed: Aug. 11, 2008

(86) PCT No.: PCT/EP2008/060521
§ 371 (c)(1),
(2), (4) Date: Nov. 2, 2010

(87) PCT Pub. No.: WO2009/019318
PCT Pub. Date: Feb. 12, 2009

(65) Prior Publication Data
US 2011/0036988 A1  Feb. 17, 2011

(30) Foreign Application Priority Data
Aug. 9, 2007 (EP) .................................. 07114122

(51) Int. Cl.
*G01T 1/24* (2006.01)
*H01L 25/00* (2006.01)
(Continued)

(52) U.S. Cl.
CPC . *G01T 1/026* (2013.01); *G01T 1/24* (2013.01); *H01L 27/14658* (2013.01); *H01L 27/14676* (2013.01); *G01T 1/247* (2013.01)

(58) Field of Classification Search
CPC ............. G01T 1/24; G01T 1/026; G01T 1/17; G01T 1/2928; H01L 27/14658
USPC .............................. 250/370.09–370.13, 336.1
See application file for complete search history.

(56) References Cited

U.S. PATENT DOCUMENTS 7,391,845 B2 * 6/2008 Konno ............................. 378/19
2002/0089595 A1 * 7/2002 Orava et al. .................... 348/302
(Continued)

FOREIGN PATENT DOCUMENTS

EP  1 069 439 A2  1/2001
JP  04-270986  9/1992
(Continued)

OTHER PUBLICATIONS

Bamberger et al., "Resolution Studies on 5GeV Electron Tracks Observed With Triple-GEM and MediPix2/TimePix-readout.", Nuclear Instruments & Methods in Physics Research, Section-A: Accelerators, Spectrometers, Detectors and Associated Equipment, Elsevier, Amsterdam, NL, vol. 581, No. 1-2, Aug. 2007, pp. 274-278.
(Continued)

*Primary Examiner* — David Porta
*Assistant Examiner* — Jeremy S Valentiner
(74) *Attorney, Agent, or Firm* — Fitch, Even, Tabin & Flannery LLP

(57) ABSTRACT

Radiation detector for measuring one or more characteristics of a radiation, comprising one or more detector pixels, a clock pulse generator, each detector pixel comprising a sensor producing an electrical signal in response to an event of a photon or charged particle of said radiation impinging on said sensor; a pixel electronics adapted for receiving and processing said electrical signal, comprising an analog processing unit for amplifying and shaping said electrical signal and producing a shaped pulse said pixel electronics comprises time determination unit for counting the TOT-count, the TOT-count being the number of clock pulses occurring during the time interval when said shaped pulse is above a threshold. Said pixel electronics comprises a plurality of event counters, each event counter counting the number of events having a TOT-count in a predefined ranges.

17 Claims, 18 Drawing Sheets

(51) Int. Cl.
*H01L 27/00* (2006.01)
*H01L 27/146* (2006.01)
*G01T 1/02* (2006.01)

(56) References Cited

U.S. PATENT DOCUMENTS

| | | | |
|---|---|---|---|
| 2002/0092970 A1* | 7/2002 | Pyyhtia et al. | 250/208.1 |
| 2004/0129887 A1* | 7/2004 | Vydrin et al. | 250/367 |
| 2004/0212708 A1* | 10/2004 | Spartiotis et al. | 348/295 |
| 2005/0139757 A1* | 6/2005 | Iwanczyk et al. | 250/239 |
| 2006/0261296 A1* | 11/2006 | Heath et al. | 250/580 |
| 2007/0023669 A1* | 2/2007 | Hefetz et al. | 250/370.14 |
| 2007/0075251 A1* | 4/2007 | Doughty et al. | 250/370.01 |
| 2007/0120062 A1* | 5/2007 | Li et al. | 250/370.09 |
| 2007/0280409 A1* | 12/2007 | Konno | 378/19 |
| 2008/0099689 A1* | 5/2008 | Nygard et al. | 250/370.09 |
| 2008/0135771 A1* | 6/2008 | Vydrin et al. | 250/370.09 |
| 2011/0051901 A1* | 3/2011 | Michel et al. | 378/165 |

FOREIGN PATENT DOCUMENTS

| | | |
|---|---|---|
| WO | 2005/008286 A2 | 1/2005 |
| WO | 2006/099003 A1 | 9/2006 |
| WO | WO2007090650 | 8/2007 |

OTHER PUBLICATIONS

MediPix2, a 64k pixel read-out with 55 μm square elements working in single photon counting code, IEEE Trans. Nucl. Sci. 49 (2002) 2279-2283.

* cited by examiner

RADIATION MONITORING DEVICE

CROSS REFERENCE TO RELATED APPLICATIONS

This application is a national phase application of International Application No. PCT/EP2008/060521, filed Aug. 11, 2008, designating the United States and claiming priority to European Patent Application No. 07114122.0, filed Aug. 9, 2007, both of which are incorporated by reference herein in their entirety.

TECHNICAL FIELD

The invention relates to the field of radiation monitoring devices for use in dosimetry, and more specifically to devices and methods using single photon counting pixel detectors.

DESCRIPTION OF RELATED ART

Pixelated semiconductor detectors are used in X-ray imaging and may be used in active personal dosimetry. A radiation monitoring device can be built using the Medipix2 chip. The Medipix2 chip and its use is described in "X. Llopart, M. Campbell, R. Dinapoli, D. San Segundo and E. Pernigotti, *MediPix2, a 64k pixel read-out with 55 μm square elements working in single photon counting mode*, IEEE Trans. Nucl. Sci. 49 (2002) 2279-2283". In the Medipix2, when a photon or charged particle interacts in the detector material, it deposits a charge which drifts towards the collection electrode. This charge is then amplified and compared with two different analog thresholds that form an energy window. If the detected charge falls inside this energy window, a digital counter is incremented. The Medipix2 detector comprises a sensor layer which is pixelated with a pixel pitch of 55 μm and a readout chip in each pixel. The electrodes of the sensor are connected pixel-per-pixel with the readout chip via bump-bonds. One counter is present in each pixel-electronics. The Medipix2-detector is used for example as an imaging detector pixel array in X-ray imaging. The number of events which have caused an energy deposition above an adjustable threshold or have caused an energy deposition between the upper and lower thresholds in the sensitive pixel volume during a measuring phase is counted in each pixel electronics. The number of photons in a certain energy range, which have been transmitted through an irradiated object, can be determined. A drawback of the Medipix2 detector in X-ray-imaging is the existence of only one lower threshold. Therefore only particles in one energy range can be counted during one acquisition. If transmission images of particles from different energy ranges should be obtained, it is necessary to take several images subsequently with different discriminator thresholds for all pixels. This leads to an increased measuring time and to an increased dose exposition of the object to be imaged. These measurements of the transmission of particles of different energies can be used to improve the contrast in combined transmission images of the object. They can also be used to retrieve information on the material composition of the object.

The use of an array of detectors and counter circuit for dosimetry is known from WO 2005/008286. Each detector pixel is provided with a single pair of low and high energy thresholds. Therefore, for measuring high dynamic range, many detector pixels are needed.

The Timepix chip was derived directly from the Medipix development. The Timepix Detector is, like the Medipix2 detector, a hybrid, counting, pixelated semiconductor detector with a pixel pitch of 55 μm. The input signal of the pixel electronics is processed in an analog circuit in the pixel electronics of the ASIC and is then compared with an adjustable threshold in a discriminator. In one operating mode of the Timepix, each pixel measures the length of the time during which the strength of the input pulse of the discriminator is higher than a threshold of the discriminator. This time interval is measured through counting of clock pulses in a counter. This method is called Time-Over-Threshold (TOT) Method. Each pixel contains only one counter. The time which is measured in the counter is transferred at the end of the measuring phase into the readout unit of the Timepix. It is then transferred to the periphery of the ASIC. The Timepix was designed to be used in gas tracking chambers in particle physics experiments without the use of a radiation sensitive sensor layer. The Timepix has some drawbacks if its Time-Over-Threshold mode is used in X-ray imaging. Only one threshold is available in each pixel. During one X-ray image, the summed time-over-threshold of all reacting particles in the sensor is counted in the counter of each pixel. After readout, no information about the individual energies of particles are available. It is not possible to have a frame rate at such a high frequency that the time-over-threshold of each particle could be determined because the fluxes of photons are very high during usual x-ray images.

Document WO2006/099003 discloses a radiation detection system wherein one or more pixilitated detectors 1 are associated each with a single channel discriminator 10. A radiation event is transformed by the single channel discriminator 10 into a count value 24 related to the energy of said radiation event. A Digital Signal Processor DSP 5, separate from the pixels 1 and from the single channel discriminators 10, is utilized with said discriminators. The DSP can be programmed for sorting the count values received from the different pixels. However, depending on the number of pixels of the pixilated detectors, the number of thresholds (i.e. the energy resolution and range of radiation detector), and the rate of incident radiation events, the DSP 5 may not be capable to cope with the incoming data.

It is an object of the present invention to provide a method and apparatus for determining one or more characteristics of radiation with high precision, high sensitivity and a large measuring range concerning particle flux density in a wide energy range, especially in the radiological diagnostics range, where the measurement is carried out in real time. It is also an object of the present invention to provide a method and apparatus for the determination of energy information of incident radiation like for example the energy spectrum or the highest energy in the spectrum, whereby the measurement can be carried out with a very high particle flux density. Such an apparatus can be used in quality assurance of medical radiation installations, e.g. X-ray tubes, or in an apparatus for the determination of the peak values of tube voltages (kVp-measurement).

SUMMARY OF THE INVENTION

The invention relates to a radiation detector for measuring one or more characteristics of a radiation, comprising one or more detector pixels, a clock pulse generator, each detector pixel comprising (i) a sensor producing an electrical signal in response to an event of a photon or charged particle of said radiation impinging on said sensor; (ii) a pixel electronics adapted for receiving and processing said electrical signal, comprising an analog processing unit for amplifying and shaping said electrical signal and producing a shaped pulse, said pixel electronics comprising a time determination unit for counting the TOT-count, the TOT-count being the number of clock pulses occurring during the time interval when said shaped pulse is above a threshold. According to the invention, said pixel electronics comprises a plurality of event counters, each event counter counting the number of events having a TOT-count in a predefined ranges.

In one embodiment of the invention, the radiation detector comprises a switching unit, said switching unit comprising a set of TOT-count limit values, defining a set of TOT-count ranges, each TOT-count range being associated with an event counter, means for detecting when a measured TOT-count is within or below a range, and means for incrementing said event counter when a measured TOT-count is within or below associated range.

In another embodiment of the invention, the radiation detector comprises a copy unit, said copy unit comprising means for receiving a TOT-count value, a set of output ports copying said TOT-count value, a set of comparing units, each comparing unit comprising a set of TOT-count limit values, defining a set of TOT-count ranges, and being associated with an event counter, and comprising means for detecting when a measured TOT-count is within or below a range, and means for incrementing an event counter when a measured TOT-count is within or below associated range.

Preferably, said pixel electronics comprises means for receiving a normalized electrical signal at the input of said analog processing unit for calibrating said detector pixel.

More preferably, said pixel electronics comprises means for receiving a normalized shaped pulse at the output of said analog processing unit for calibrating said detector pixel.

In a variation of the invention, the radiation detector comprises an array of detector pixels said array comprising columns of detector pixels, a readout unit, and means for transferring the counts accumulated in a column to said readout unit while counting in said column only is disabled, each column being transferred successively.

In another variation of the invention, the radiation detector comprises an array of detector pixels, means for transferring said TOT-counts of said detector pixels of said array in a readout unit, means for grouping pixels having a non-zero TOT-count value in islands; and means for summing the deposited dose in each of the detector pixels of an island for obtaining the energy of a photon or charged particle of said radiation producing said island.

In a preferred embodiment of the last variation, the radiation detector comprises a microcontroller adapted for determining the dose and/or the dose rate of said impinging radiation. According to this embodiment, a low-flux dosimeter is obtained.

In another preferred embodiment of the last variation, the radiation detector comprises a microcontroller adapted for determining the spectrum of said impinging radiation, and/or for determining the radioisotope or radioisotopes producing said radiation.

In still another embodiment of the invention, the radiation detector comprises a first group of detector pixels having a first sensitive area, and a second group of detector pixels having a second sensitive area, the first sensitive area being larger than the second sensitive area, whereby the first group measure radiation at low dose rates, and the second group measure radiation at high dose rate.

In the last embodiment, said first group may comprise pixels having a pixel electrode for collecting said electrical pulse, a guard electrode being adjacent to said pixel electrode and connected to a fixed potential, whereby the sensitive volume of said sensor is restricted.

DETAILED DESCRIPTION OF THE INVENTION

Mechanical Setup of a Detector

Figure 1:
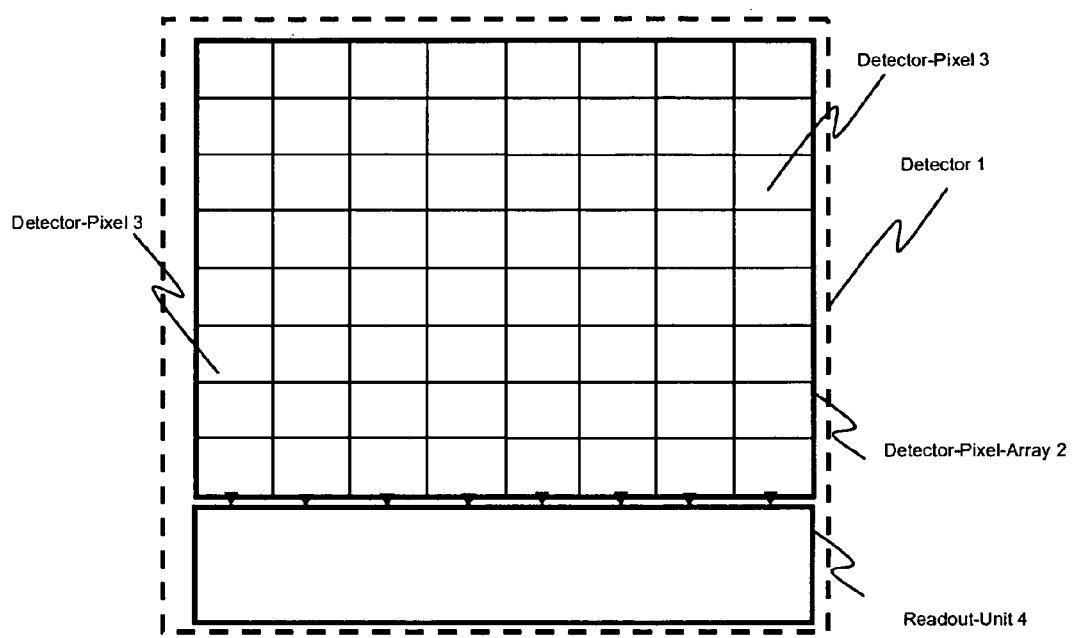
FIG. 1 is a schematic top view of a radiation detector according to the invention.
Figure 2:
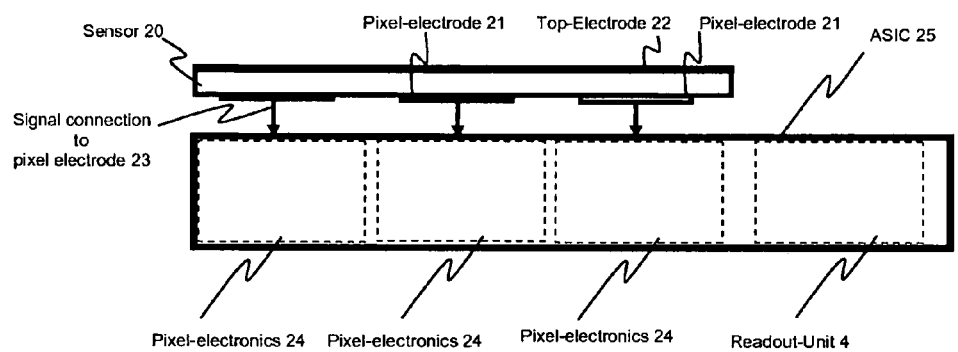
FIG. 2 is a schematic side view of a cross section of the radiation detector of FIG. 1.
Figure 3:
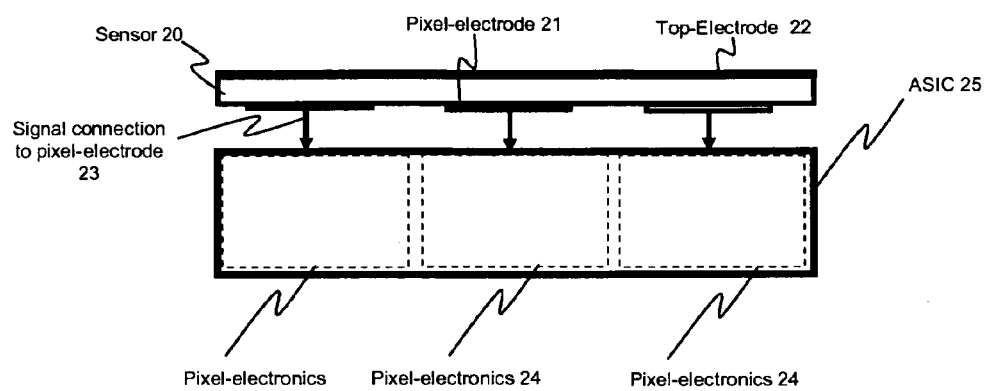
FIG. 3 is a schematic side view of another cross section of the radiation detector of FIG. 1.
Figure 4:
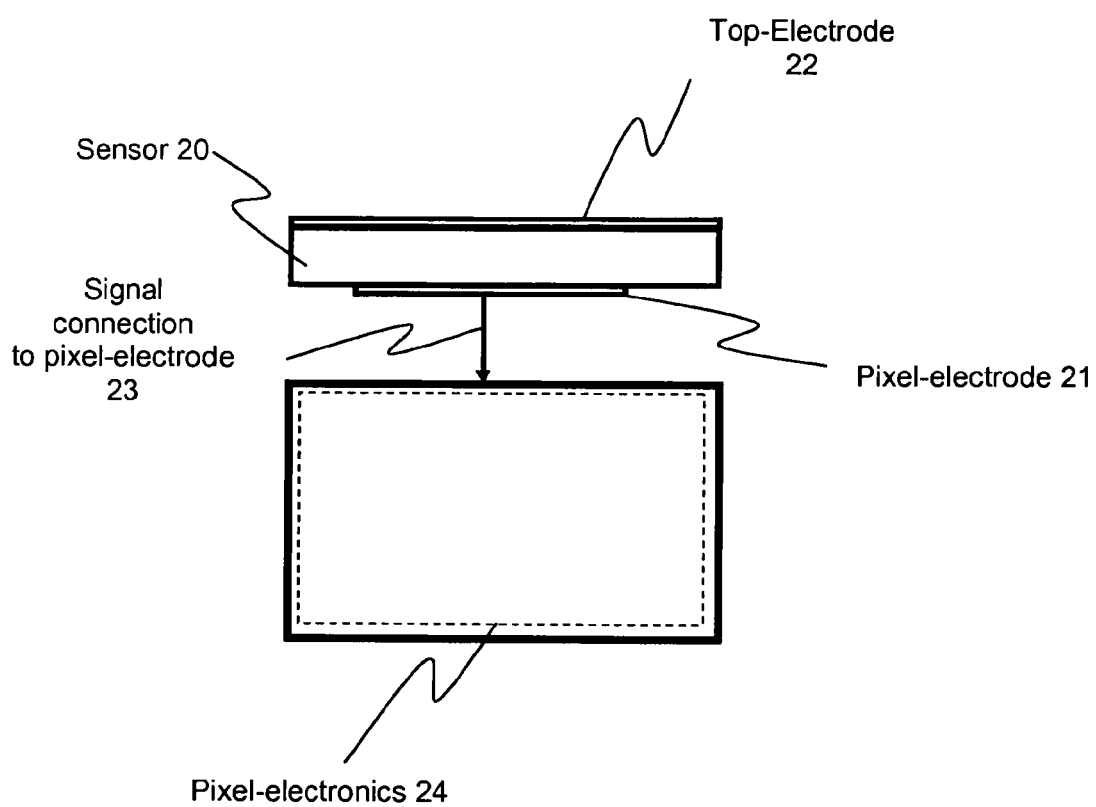
FIG. 4 is a schematic side view of the cross section of a detector pixel.

FIG. 1 is a schematic top view of a radiation detector 1 comprising a detector pixel array 2 formed by a plurality of individual detector pixels 3. A readout unit 4 is arranged on a side of the detector pixel array 2. Referring to FIGS. 2, 3 and 4, the radiation detector 1 comprises the following components:

- A sensor 20. The sensor can be made of a semi-conductor material producing charge carriers when impinged by a photon. Silicon, Gallium arsenide, Cadmium telluride, Cadmium Zinc telluride or Mercury iodide can be used as sensor materials. The sensor material can extend over a plurality of detector pixels 3.
- A top electrode 22 extending over the sensor 20. The top electrode is a thin layer of electrically conducting material, made of carbon or copper.
- A plurality of pixel electrodes 21. The pixel electrodes extend only over a single detector pixel. A voltage is applied between the top electrode 22 and the pixel electrodes 23 for collecting the charges produced by a photon impinging on the sensor 20.
- A pixel electronics 24, associated with every detector pixel 3, and connected to the corresponding pixel electrode 21. The pixel electronics 24 is located within the detector pixel's footprint
- A readout unit 4, arranged on a side of the detector pixel array 2.

The pixel electronics 24 and the readout unit 4 are realized as a single application-specific integrated circuit (ASIC) 25. The sensitive volume of a detector pixel 3 is formed by the sensor 20 volume between the surrounding area of the pixel electrode 21 and the upper side of the sensor 20.

Pixel Electronics

Figure 5:
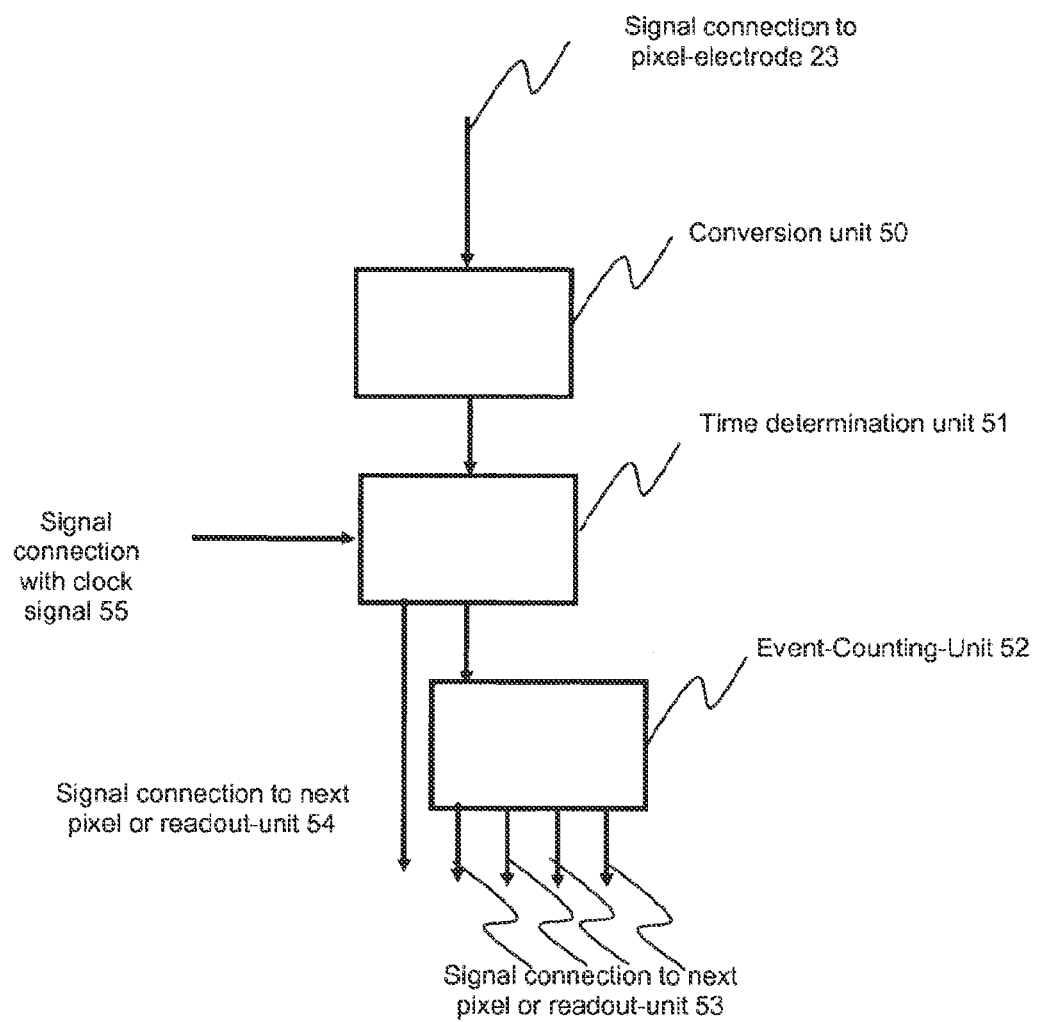
FIG. 5 is a schematic block-diagram of the pixel-electronics of a detector pixel.
Figure 6:
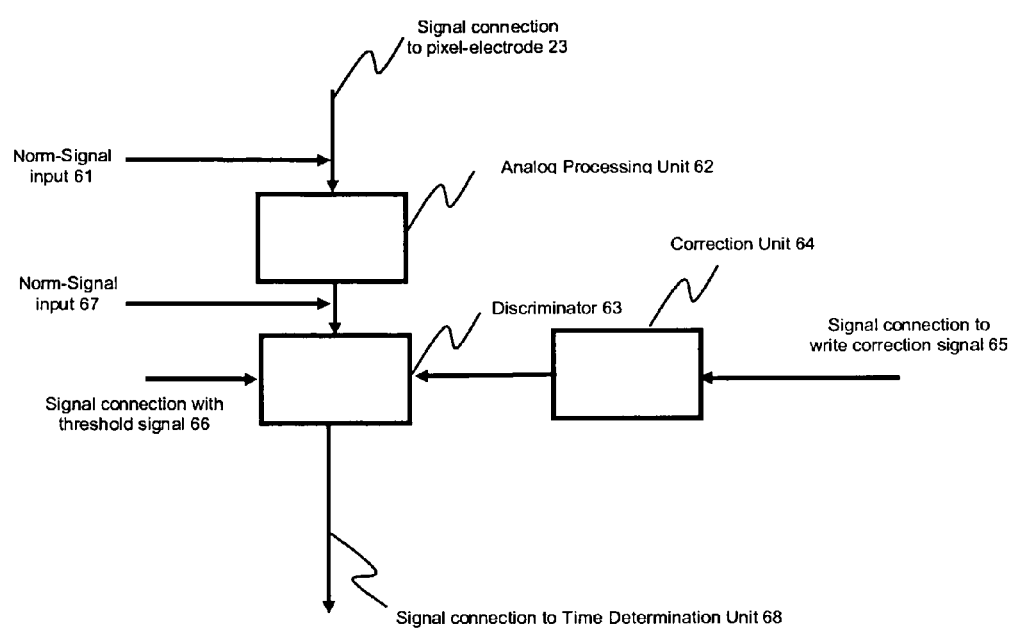
FIG. 6 is a schematic block-diagram of a conversion-unit of the pixel electronics of a detector pixel.
Figure 7:
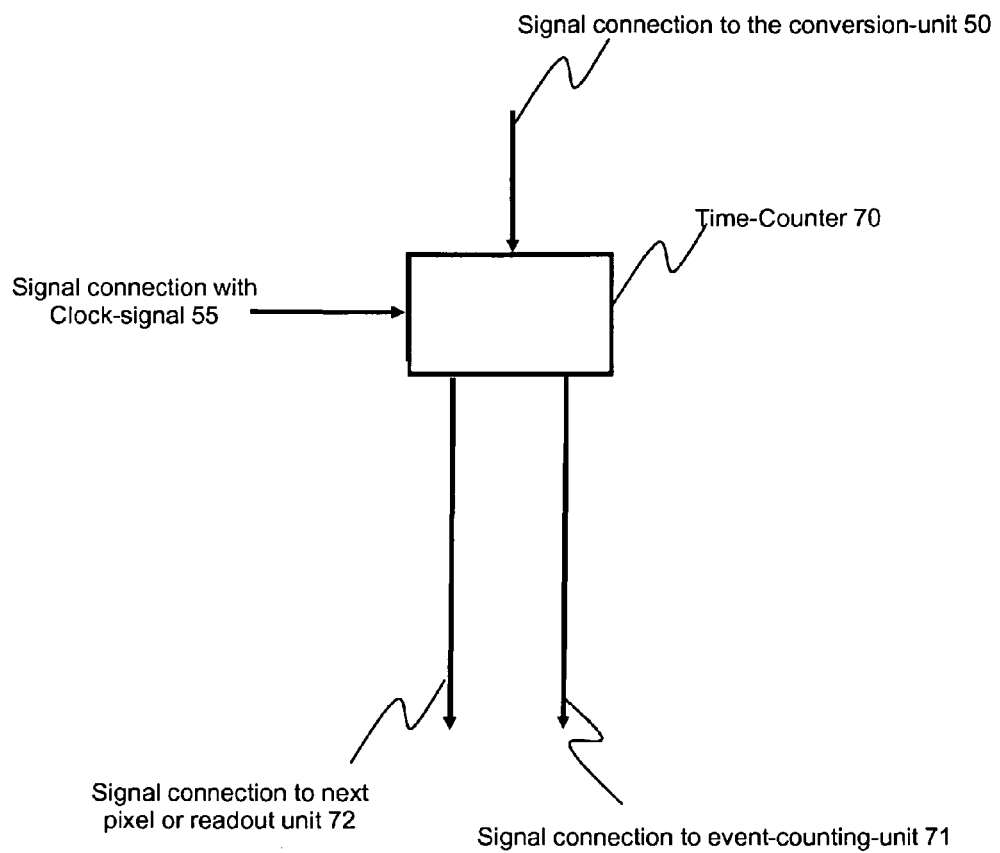
FIG. 7 is a schematic block-diagram of a time-determination-unit 51 of a pixel-electronics of a detector pixel.
Figure 8:
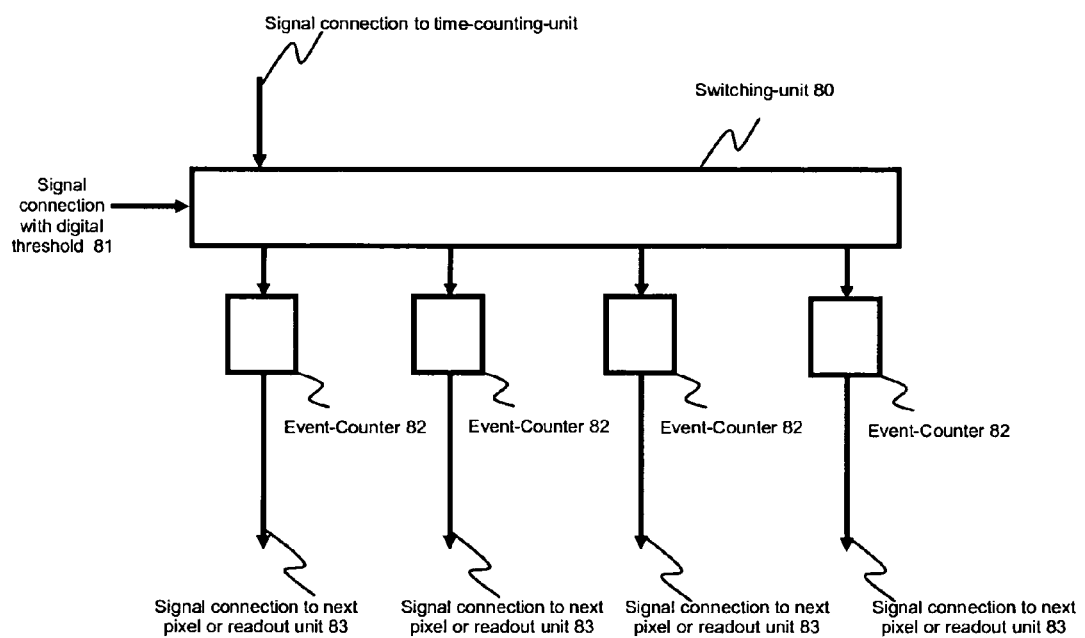
FIG. 8 is a schematic bloc-diagram of a first embodiment of an Event Counting Unit of the pixel electronics of a detector pixel.
Figure 9:
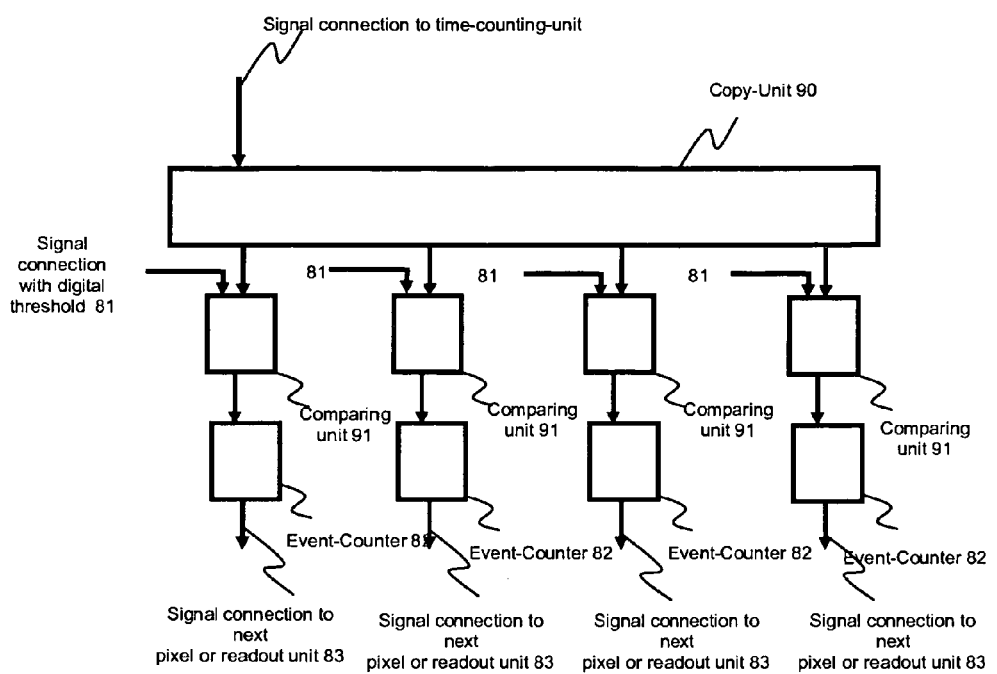
FIG. 9 is a schematic bloc-diagram of a second embodiment of an Event Counting Unit of the pixel electronics of a detector pixel.

Referring to FIG. 5 and FIG. 6, the pixel electronics is described. The analog signal coming from the pixel electrode 21, produced by the reaction of a photon or particle in the sensor 20, in each detector-pixel 3 is transferred to a conversion unit 50 in the pixel electronics 24. The conversion unit 50 converts the analog signal into a digital signal as explained hereafter. In the conversion unit 50 first an analog processing unit 62 processes the measured signal. For example the signal is amplified and pulse shaped by the analog processing unit 62. The output of the analog processing unit 62 is compared to an adjustable threshold in the discriminator 63 of the conversion unit 50. The threshold of the discriminator 63 is set above the noise level of the output signal of the analog processing unit 62. The threshold corresponds to an energy deposition $E_{thr}$ in the sensor 20 of the detector pixel 3. The threshold is set below the maximum expected particle energy. Each pixel electronics 24 comprises a correction unit 64, which is able to modify the threshold so that an adjustment of the threshold of discriminator 63 of different detector pixels 3 can be performed. The correction unit 64 is in signal connection with the periphery of the detector pixel array 2. A digital signal, which is given to each detector pixel 3 from outside the detector pixel array 2 and which is stored in the correction unit 64, produces an electrical signal—e.g. a voltage level— in the correction unit 64, which modifies the position of the threshold of the discriminator 63. An adjustment of the thresholds of different discriminators 63 of different detector pixels is obtained by choosing an intelligent set of digital signals which are sent to and stored in the correction units 64. The thresholds can be adjusted using the noise level of the outputs of the analog processing units 62 or using norm-signals which are injected via the signal connections 61 or 67. The duration of the output signal of the discriminator 63 has a fixed relation to the time during which the strength of the output signal of the analog processing unit 62 is higher than the threshold of the discriminator 63. For example the output signal of the discriminator 63 is as long as the input signal of the discriminator 63 is above the threshold. The conversion unit 50 is designed and implemented in a way that the time of the output signal of the analog processing unit 62 being above the threshold has a fixed relationship to the strength of the input signal of the conversion unit 50. Therefore the duration of the discriminator 63 output signal is standing in fixed relationship to the energy deposition $E_{Event}$ in a detector pixel 63.

Norm Signal

Referring to FIG. 6, a norm signal, which has a similar shape like the particle reaction induced signal in the pixel electrode 21, can be injected via the signal connection 61 into the input of the analog processing unit 62 of each detector pixel 3 or can be injected via the signal connection 67 into the input of the discriminator 63 of each detector pixel 3. The norm signal has a known strength. The strength can be for example the maximum current value or the total charge flowing after the reaction of a particle in the sensor 20 of the detector unit 3 via the signal connection 23 into the analog processing unit 62 if signal connection 61 is used or the corresponding values after analog processing in the analog processing unit 62 of the signal in the pixel electrode 24 after particle reaction if signal connection 67 is used. Ideally the norm signals are identical for all detector pixels 3.

Time Determination Unit

Each detector pixel 3 has a time determination unit 51 in its pixel electronics 24. Each time determination unit 51 is supplied with a clock signal via a signal connection 55. For example a clock frequency of 100 MHz is used. For example the clock pulses are injected into the detector pixel array 2 at the top of each column of the detector pixel array 2 and the clock pulses are transferred from one detector pixel 3 to the next detector pixel 3 in the column. In order to obtain a high energy resolution, a high clock frequency may be used or the duration of the discriminator 63 output signal has to be long. The drawback of a long output signal length of the discriminator 63 is that the maximum processable count rate is reduced. If a high clock frequency is used, preferably the detector has a low number of rows in order to avoid smearing of the clock pulse edges during their transfer through the columns.

The time determination unit 51 has a counter, which we call time counter 70. The time counter 70 starts counting clock pulses after the output signal of the discriminator 63 appears at the input of the time counter 70. The time counter 70 stops counting clock pulses after the output signal of the discriminator 63 disappears at the input of the time counter 70.

Therefore the number of clock pulses, which are counted by the time counter 70 after the reaction of a particle in the sensor 20, has a fixed relationship to the strength of the input signal of the pixel electronics 24 and therefore has a fixed relationship to the energy deposited in the sensitive volume of the detector pixel 3. If the whole kinetic energy of the particle is deposited in one detector pixel 3 the number of counted clock pulses in the detector pixel 3 corresponds to the kinetic energy of the particle.

The number of counted clock pulses which are counted by the time counter 70 shall be denoted as $T_{Event}$. The output signal of the time counter 70 is digital and corresponds to $T_{Event}$.

Event Counting Unit

An inventive step is to perform a "digital discrimination" with the time over threshold measured in each pixel electronics 24 after each reaction of a particle in the sensor 20. All detector pixel arrays of the prior art which are known to the inventors are deriving the energy deposition spectrum by comparing the analog measuring signal with different thresholds in different discriminators. The purpose of the "digital discrimination" is to assign the energy deposition in the detector pixel 3, measured as $T_{Event}$, to an energy interval and to count the number of events with energy deposition in the intervals during a measuring phase simultaneously.

A conversion of the analog processed measuring signal after the analog processing unit 62 into a digital time signal measured with the time counter 70 with subsequent comparison of the signal output of the time counter 70 with digital thresholds with subsequent counting of events in the event counting unit 52 will have several advantages for dosimetry. One advantage is the flexibility in the energy interval setting because the thresholds are sent to and stored in the event counting unit 52. The programming of the thresholds in a digital manner is a very flexible way of setting thresholds. This is an important advantage in a detector pixel array 2 with a large number of detector pixels 3 and in the case of the necessity of a lot of energy intervals. Another advantage is the reduced power consumption of the detector pixel array 2 due to the fact that only one analog processing unit 62 and one discriminator 63 is present in each detector pixel 3.

The number of clock pulses counted by the time counter 70, denoted as $T_{Event}$, can be processed in different ways in the pixel electronics 24.

For example one unit of the pixel electronics 24—the so called switching unit 80—decides to which energy interval an event is assigned. The digital signals, containing the information about all the digital thresholds, are sent to the switching unit 80 in a digital way before the measurement. This information is stored in the switching unit 80.

First this working principle using the switching unit 80 is described.

The number of clock pulses counted in the time counter 70 is compared in the switching unit 80, which is in signal connection to the output of the time counter 70, with at least two different full numbers $T_i$ (i=1, 2, 3, . . . , $i_{max}$). For example, in detector pixel 3 with number m a comparison with 16 numbers $T^m_i$ is performed. Each number $T^m_i$ corresponds to a energy deposition $E^m_i$ in the sensor 20 of the detector pixel 3. The numbers $T^m_i$ are transferred to the switching unit 80 before the measurement and are stored in the switching unit 80. We assume $T^m_i < T^m_{i+1}$ for all 1<i< ($i_{max}$−1). Additionally we assume: $E^m_i < E^m_{i+1}$ for all 1<i< ($i_{max}$−1). The number $T^m_i$ are the digital thresholds.

A measuring time consists of measuring phases which are separated by readout phases of the detector pixel array 2. In the switching unit 80 in a working principle 1 the interval [$T^m_j$, $T^m_{j+1}$ [containing the digital signal $T_{Event}$, which appears at the output of the time counter 70, can be determined through a comparison between the digital signal $T_{Event}$ and all $T^m_j$. One j fulfils $T^m_j <= T_{Event} < T^m_{j+1}$. So the switching unit 80 determines, in which energy interval the energy deposition $E_{Event}$ of the processed event in the detector pixel 3 is found: $E^m_j <= E_{Event} < E^m_{j+1}$.

The switching unit 80 is connected to counters, which shall be named event counters 82, in each detector pixel 3.

In working principle 1 the switching unit 80 sends a signal to the event counter 82j. Event counter 82j is then incremented by 1. Therefore event counter 82j counts an energy deposition $E_{Event}$ with $E_{j+1} > E_{Event} > E_j > E_{thr}$ in the detector pixel 3. At the end of the measuring phase the counting of events in the event counters 82 is stopped. At the end of the measuring phase the number of counts $N^m_i$ in the event counter 82i of the detector pixel 3 m is the number of particles which deposited an energy between $E^m_i$ and $E^m_{i+1}$ in the detector pixel 82m for all i. The i-series of counter values $N^m_i$ in detector pixel 3 m then is a sampled version of the energy deposition spectrum $(N_{Pixeldeposition})^m_i$ of the impinging radiation in detector pixel 3 m.

The pixel electronics 24 of the detector pixels 3 can also work in a working principle 2 in which for each digital signal $T_{Event}$ appearing at the output of the time counter 70 the maximum number j is determined for which $T^m_j < T_{Event}$ is true.

In working principle 2 the switching unit 80 sends signals to all event counters 82 i with i<=j. All event counters 82 i with i<=j are incremented by 1. The event is thus counted in several event counters 82. In working principle 2, the number of counts $N^m_i$ of an event counter i of the detector pixel 3 m is the number of particles, which deposited an energy bigger than $E^m_i$ in the detector pixel 3. The sampling of the energy deposition spectrum $(N_{Pixeldeposition})^m_i$ as a series in i in detector pixel 3 m is derived by subtracting the numbers of counts of subsequent counters: $(N_{Pixeldeposition})^m_i = N^m_i - N^m_{i+1}$.

Now we describe the working principle using the copy unit 90 and the comparing units 91 in the event counting unit 52.

The decision, in which energy deposition interval the energy deposition $E_{Event}$ lies, is made separately in several comparing units 91 in the event counting unit 52 of the detector pixel 3. To do this, the output signal of the time counter 70 is copied in the copy unit 90 to several outputs of the copy unit 90. The copy unit 90 sends the copy of the signals simultaneously to several comparing units 91 in the event counting unit 52. The signal containing the information about the digital thresholds is sent to and stored in the comparing units 91 before the beginning of the measuring phase.

The copy unit 90 has a signal connection to $i_{max}$ comparing units 91. The number of counted clock pulses in the time counter 70 is compared in each comparing unit 91i of each detector pixel 3 m with a full number $T^m_i$ (i=1, 2, 3, . . . $i_{max}$). For example 16 comparing units 91 are present in each pixel electronics 24. The numbers $T^m_i$ are the digital energy thresholds and define energy deposition intervals. The number $T^m_i$ are sent to and stored in the comparing units 91 in a digital way before the beginning of the measuring phase. We assume $T^m_i < T^m_{i+1}$ for all 1<=i<=($i_{max}$−1). Furthermore it is: $E^m_i < E^m_{i+1}$ for all 1<i<($i_{max}$−1) where $E^m_i$ is the energy deposition corresponding to $T^m_i$. Each comparing unit 91i of detector pixel 3 m performs a comparison and decides if $T^m_i < T_{Event}$ is true for an event with an energy deposition bigger than $E_{thr}$. If this is true, the event counter 82i connected to the comparing unit 91i is incremented by 1. There is one event counter 82 in signal connection to each comparing unit 91. Therefore the impinging particle is counted in all event counters 82 whose comparing units 91 decide that $T^m_i < T_{Event}$ is true. At the end of the measuring phase the counting of events in the event counters 82 is stopped. The number of counts $N^m_i$ of an event counter 82i of the detector pixel 3 m is then the number of particles whose energy deposition in detector pixel 3 m is bigger than $E^m_i$. The sampling of the energy deposition spectrum $(N_{Pixeldeposition})^m_i$ as a series in i in detector pixel 3 m is derived by subtracting the numbers of counts of subsequent counters:

$$(N_{Pixeldeposition})^m_i = N^m_i - N^m_{i+1}.$$

It is also possible to perform comparisons in the comparing units 91 of $T_{Event}$ with two full numbers $T^{m\,low}_i$ (i=1, 2, 3, . . . , $i_{max}$) and $T^{m\,high}_i$ (i=1, 2, 3, . . . , $i_{max}$). If $T^{m\,low}_j <= T_{Event} <= T^{m\,high}_j$ is true, the event counter 82 connected to the comparing unit 91 j is incremented by 1. It is then possible to count events in energy intervals.

The described principles of digital discrimination and counting allow the counting of particles with energy depositions in several energy deposition intervals simultaneously.

For all principles, the time counter 70 is set to zero after the comparisons of $T_{Event}$ with the digital thresholds have been performed and the event has eventually been counted. The time counter 70 is then ready to determine $T_{Event}$ of the next reacting particle in the sensor 20.

Figure 10:
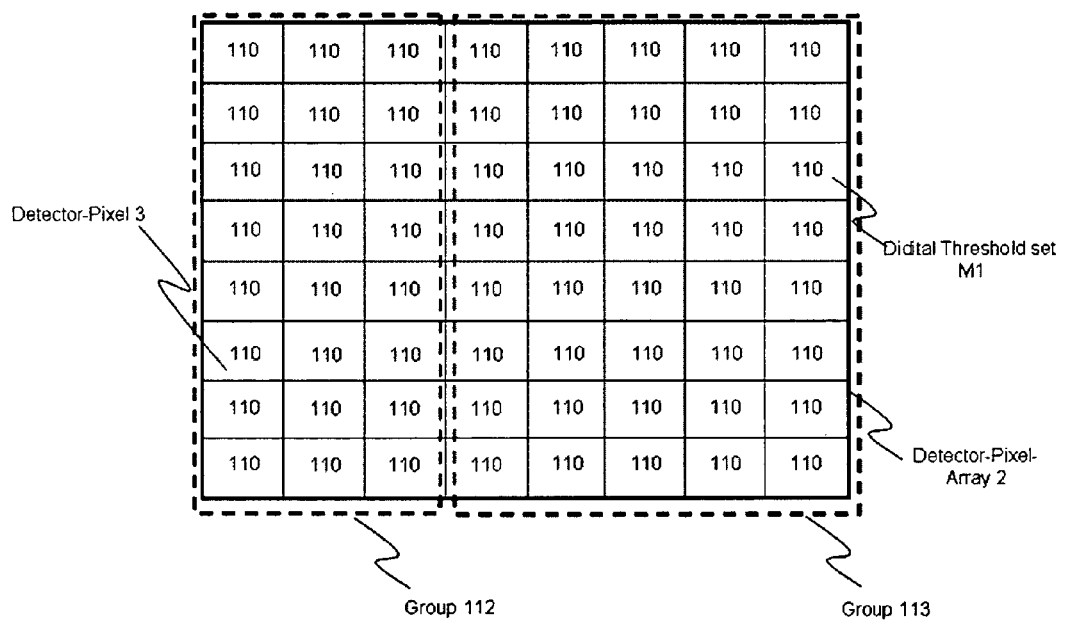
FIG. 10 is schematic of an example of a distribution of a threshold setting of the Event Counting Units of a detector pixel array of a radiation detector to be used in dosimetry.

FIG. 10 schematically shows a distribution of digital energy thresholds on the detector pixel array 2, where the set of digital energy thresholds is denoted as $M_1$ (110): $M_1 = \{T_i | i=1, \ldots, i_{max}\}$. M1 is identical for all detector pixels 3. In X-ray imaging $i_{max}=8$ and $M_1=\{10\text{ keV}, 30\text{ keV}, 50\text{ keV}, 70\text{ keV}, 90\text{ keV}, 110\text{ keV}, 130\text{ keV}, 150\text{ keV}\}$ is for example one possible choice.

Figure 11:
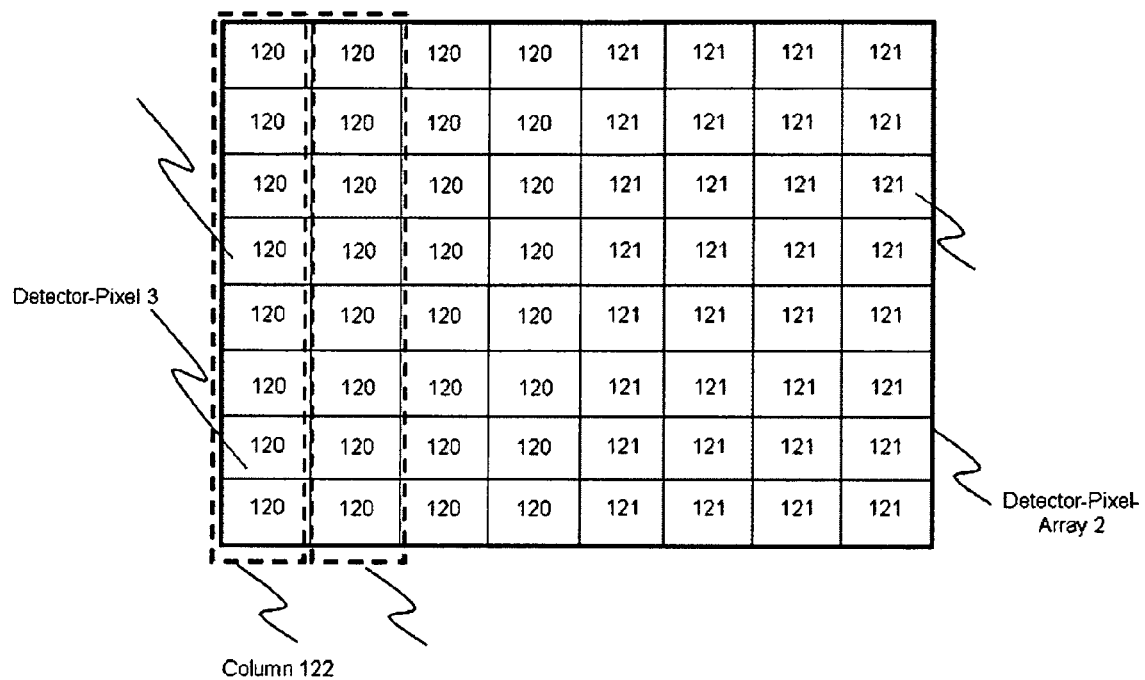
FIG. 11 is a schematic of another example of a distribution of two threshold settings of the Event Counting Units of a detector pixel array to be used in dosimetry.

In dosimetry it is possible to use different digital energy thresholds $T^m_i$ in different detector pixels 3 $m$. It is an inventive step to realize that the dose measurement is more exact if several sets of digital thresholds are used in the detector pixel array 2. FIG. 11 schematically shows the distribution of two sets M2 (120) and M3 (121) of digital thresholds in the detector pixel array 2. The thresholds of one set are chosen to be between the thresholds of the other set. For a given width of the whole energy deposition range and for a given number $i_{max}$ of thresholds, a higher precision of the determined dose can be obtained, because the sampling of the energy deposition spectrum with the thresholds of the whole detector pixel array 2 is finer. One possible example for the number of thresholds and the threshold sets to be used in dosimetry in radiological diagnostic applications is: $i_{max}=8$ and $M_2=\{10\text{ keV}, 30\text{ keV}, 50\text{ keV}, 70\text{ keV}, 90\text{ keV}, 110\text{ keV}, 130\text{ keV}, 150\text{ keV}\}$ and $M_3=\{20\text{ keV}, 40\text{ keV}, 60\text{ keV}, 80\text{ keV}, 100\text{ keV}, 120\text{ keV}, 140\text{ keV}, 160\text{ keV}\}$.

By using the pixel design of the present invention, one obtains a versatile detector array that can perform the digital discrimination into a plurality of energy bins in each of the pixel individually, with threshold sets defined for each pixel.

Readout Unit

The transfer of the data measured in the time counters 70 or in the event counters 82 can be done in several operating principles. A common feature of all operating principles is that the counters values of the time counters 70 or the event counters 82 are set to zero if the counter values are completely transferred into the readout unit 4.

For example the counting of events in the whole detector pixel array 2 is stopped at the appearance of a signal from the periphery of the detector pixel array 2. During the following transfer of the counter values to the readout unit 4 the counting of events in the detector pixel array 2 is suppressed. Then the transfer of the counter values from the detector pixels 3 into the readout unit 4 is carried out. For example the time counters 70 or event counters 82 can act as shift registers during this counter value transfer. All counter values in one row can be shifted bit by bit simultaneously into the readout unit 4. The readout unit 4 receives the counter values row by row. Drawback of this working principle is that the detector pixel array 2 is not able to count events in the event counters 82 or time counters 70 while shifting the counter values to the readout unit 4. A dead time of the detector 1 arises.

It is possible to avoid the dead time by having $2*i_{max}$, event counters 82 or two time counters 70 in the pixel electronics 24 of each detector pixel 3. The two sets of counters are identical with respect to their thresholds. One set is active and able to count particles while the counter values of the other set is transferred into the readout unit 4. A drawback of this solution is the increased design complexity and increased power consumption of the detector 1.

Another possibility to avoid dead time of the whole detector is to suppress the counting of particles in one group (112) of detector pixels (134) while the counter values of their event counters 82 are transferred to the readout unit 4. During this transfer the event counters 82 of another group (113) of detector pixels 3 are counting events. The event counters 82 of the group (113) stop the counting of particles at the moment the transfer of the counter values of the event counters 82 of group (112) is finished. The event counters 82 of the group (112) then start being active for counting events. The counter values in the event counters 82 of the group (113) are then transferred into the readout unit 4. The groups (112) and (113) alone are not working without dead time, but their combination is dead time free. The whole detector pixel array 2 is always able to count events.

Another readout principle is that at every moment only one column (122) of the detector pixel array 2 is in its transfer phase of its counter values. The event counters 82 or the time counters 70 of this column (122) are not counting or registering events during the transfer phase of the column (122). All the other columns of the detector pixel array 2 are able to count and register events during the transfer phase of column (122). After the transfer of the counter values of column (122) is finished, the counters of column (122) are active and able to count. Then the counting and registration of events in the counters of another column (123) is suppressed and the counter values of column (123) are transferred into the read out unit 4. In this way all columns are read out successively. This readout scheme is preferred for the use in a dosemeter. The reason is, that in every moment a part of the detector pixel array 2 is able to register events. Therefore it is possible to measure even very short radiation exposures which occur for example in X-ray applications. The dosemeter is then dead time free.

The readout unit 4 is also supplying the detector pixel electronics 24 with necessary electrical currents or voltages, reference signals for the thresholds in the discriminators 63, the clock signals for the time counters 70 and signals for the transfer of counter values. The readout unit 4 also sends the signals containing the information about the digital thresholds to the switching unit 80 or the comparing units 91.

Activity Signal (FIGS. 14, 16, 17, 18) for Dosimetry

The readout frequency of the detector pixel array 2 has an impact on the power consumption of the detector 1. A low readout frequency leads to low power consumption, but in case of high doserates the counting range of the event counters 82 may be not sufficient to count all events between two readout phases. If the readout frequency is too low, the measuring range concerning the doserate would thus be limited.

An inventive step is to make the readout frequency depending on the actual event rate and thus dose rate.

To do this, the counters of the detector pixels 3 are read out with a minimum frequency. For example a read out can be performed every second. Most of the time there are only a few events per second expected if the detector 1 is used in an active personal dosemeter. There is at least one detector pixel 3, which shall be called activity detector pixel (151), in the detector pixel array 2, which produces a signal, called activity signal, which depends on the rate of counted events and therefore depends on the dose rate.

It is possible to get such an activity signal from one event counter in one special detector pixel (151) which is different from the other event counters. This special event counter can be realized as a self clearing counter. The activity signal appears at one output of the detector pixel (151) if the dose rate exceeds a pre defined value. The activity signal reaches the readout unit 4. Upon appearance of the activity signal, a read out phase of the detector pixel array 2 is triggered and the readout frequency is increased for a certain time.

It is also possible to create a signal, monitoring the activity, by a measurement of the current flowing through the complete sensor 20. The current flowing through the sensor 20 is depending on the doserate. The current flowing through the sensor can be measured in a special electronic unit of the dosemeter. If the current exceeds a pre defined value, a readout of the detector 1 is triggered and the readout frequency is increased for a certain time.

A microcontroller (186) is responsible for controlling all the electrical parts of the dosemeter, the analysis and storage of the counter values transferred to it from the readout unit 4, the calculation of the dose values and the display of the measured values in the display (180). The microcontroller (186) is also contributing significantly to the power consumption of the electronics in the dosemeter. To reduce the power consumption, the microcontroller is in a power-saving mode between the readout phases of the detector 1. The microcontroller (186) switches to an operating mode at the appearance of the activity signal or at the times of the normal low frequency readout. The microcontroller (186) triggers the readout of the counters of the detector 1, receives the data from the readout unit 4, performs data analysis, updates the display and eventually modifies the readout frequency.

Time Counter Readout and Isotope Identification

It is possible to realize the detector pixel array 2 in such a way, that optionally the event counters 82 or the time counter 70 are read out. The readout principles of the time counters 70 are similar to the readout principles of the event counters 82 described above.

The readout of the time counter 70 can be used at low dose rates in a dosemeter or in an apparatus to determine the composition of radiation emitting substances.

After the time counter values of all detector pixels 3 acquired during a measuring phase have been transferred to the microcontroller 186, the microcontroller 186 analyses the so called time image. The time image is the mapping of the column number and row number of detector pixels 3 to their values in the time counters 70. We assume a low dose rate so that the number of detector pixels 3 showing non-zero counter values in one time image is low.

At low dose rates the number of detector pixels 3, whose time counters 70 show non zero values, in the time image is low. The microcontroller carries out an algorithm which searches for groups of neighbouring detector pixels 3 showing non-zero counter values in the time image. These groups shall be named hit-groups. The length of the measuring phase has to be chosen that short so that different hit-groups in the time image have no common detector pixels 3. Thus the hit-groups are separated.

In pixelated detectors processes like extended path lengths of secondary Compton electrons produced in the sensor 20 or diffusion of charge carriers in the sensor 20 lead to a distribution of charge carriers between neighbouring detector pixels 3. To determine a more correct energy deposition value, the energy deposition of neighbouring pixels which is deposited by one impinging particle has to be added in the microcontroller (86) after readout of the detector 1.

The counter values of the time counters 70 of the detector pixels 3 are therefore added for each hit-group separately.

The microcontroller has access to a look-up table or a formula for each detector pixel 3. This look-up table or formula creates a relationship between the number of clock pulses counted in the time counter 70 of each detector pixel 3 to the corresponding energy deposition. This relation shall be denoted $E^{depos} = f_{m,n}(T_{Event})$ for detector pixel 3 in column m and row n. For each detector pixel 3 $f_{m,n}$ is known through a calibration procedure using radiation with known energy, using a simulation tool or using the above mentioned norm signals.

The calculation of the energy deposition $E^{depos}$ using $f_{m,n}$ ($T_{Event}$) may be necessary to correct for variations in the energetic positions in the thresholds of the discriminators 63 or variations in the amplifying or pulse shaping characteristics of the analog processing units 62.

The total energy deposition E in the sensor volume of a hit group consisting of z detector pixels 3, where the detector pixels 3 of the hit group are characterized by their column $m_i$ and row $n_i$ (i=1, z), is then:

$$E = \sum_{i=1}^{z} f_{m_i,n_i}(T_{Ereignis,m_i,n_i}),$$

where the time counter 70 of detector pixel 3 in column $m_i$ and row $n_i$ has counted $T_{Event,m_i,n_i}$ clock pulses.

The energy resolving properties of the detector 1 and the quality of determined energy deposition spectra can be improved using this look-up table or formula f.

With this method and embodiment of the detector 1 the energy deposition of each detected particle can be determined. The microcontroller (186) then acquires a histogram of the number of events in certain energy deposition intervals. The statistics of this histogram is improved by adding up the histogram entries of different measuring phases during the measuring time. This energy deposition spectrum can be used to determine dose values using methods described in DE 102006006411.9. Due to the fact that the impact of charge carrier distributing effects in the sensor 20 are minimized by adding up the energy deposition in hit-groups, the systematic error of the measured dose value is reduced. This advantage can be important at low dose rates where the summing in hit-groups works.

The aim of the isotope identification is to determine the nuclides emitting the radiation which is measured. The isotopes to be determined emit characteristic radiation. This radiation may consist of fluorescence photons with characteristic energy, decay photons with characteristic energy, alpha particles with characteristic energy or electrons with characteristic maximum energy from nuclear decays. A comparison of the measured energy deposition spectra, measured can be compared in the microcontroller or in an connected computer with energy deposition spectra simulated with a model or obtained in measurements with known radiation fields. The energy deposition spectra simulated with a model or obtained in measurements with known radiation fields shall be called calibration spectra. A deconvolution of the measured energy deposition spectra into a linear combination of calibration spectra can be performed. This deconvolution method can use a pseudoinverse Matrix or the maximum likelihood method or the an iterative subtracting method.

Instead of performing a deconvolution it is possible to identify local maxima in the measured energy deposition spectrum and to compare the energetic locations of the local maxima in a look-up table with the characteristic emission lines of isotopes.

Figure 12:
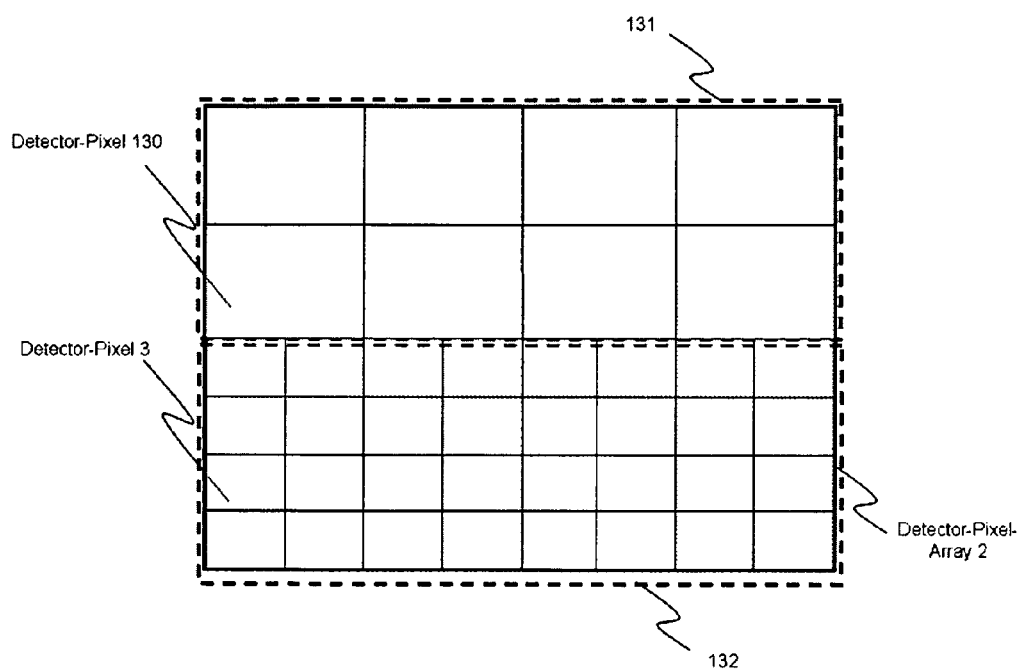
FIG. 12 is a schematic of an example of a distribution of two types of detector pixels on a detector pixel array.
Figure 13:
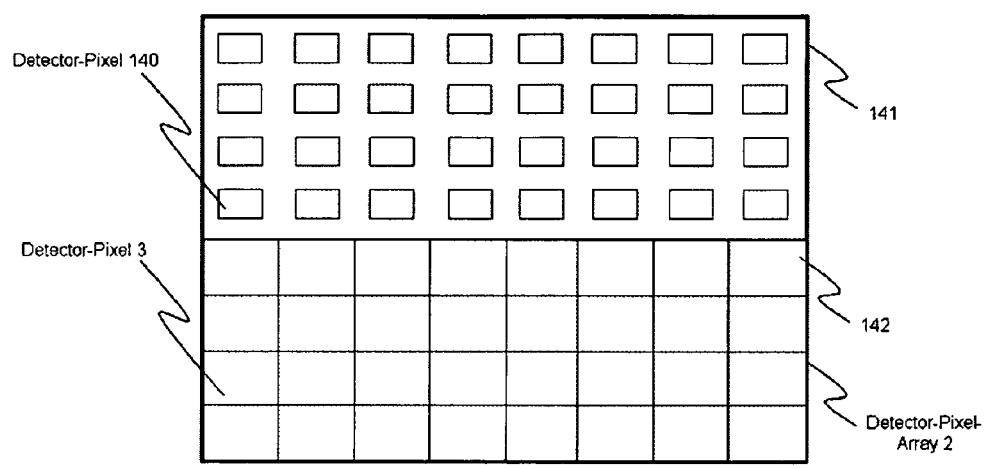
FIG. 13 is a schematic of another example of a distribution of two types of detector pixels on the detector pixel array.

Sensitive Areas of the Detector Pixels (FIGS. 12-13)

At high dose rates the count rate of a single detector pixel 3 may be high. For example the count rate of a quadratic area detector pixel 3 with 220 μm side length and a sensor 20 consisting of a silicon layer with 1000 μm thickness is higher than 100 kHz for low photon energies at 1 Sv/h. Such a high count rate could exceed the capacity of the counters 82. To extend the measuring range in dose rate, the detector pixel array 2 can be built of detector pixels 3 with different sensitive areas. The number of counts in the event counters 82 in the large sensitive area detector pixels 3 can be used to determine the dose at low dose rates. The number of counts in the event counters 82 in the small sensitive area detector pixels 3 can be used to determine the dose at high dose rates. A typical combination of sensitive areas of detector pixels 3 to be used in a dosimeter is: 220 µm×220 µm and 55 µm×55 µm. FIG. 12 shows a first possibility to realize different sensitive detector pixel areas in the detector pixel array 2. One realizes different types of detector pixels 3 with different sensitive areas by having a first group 131 of detector pixels 3 in the detector pixel array 2 whose detector pixels 3 have a certain distance between their pixel electrodes 21 and a certain area of their pixel electrodes 21 and a second group 132 of detector pixels 3 in the detector pixel array 2 whose detector pixels 3 have another distance between their pixel electrodes 21 and another area of their pixel electrodes 21. FIG. 13 shows another possibility to realize different sensitive detector pixel areas in the detector pixel array 2. This is done by constricting the sensitive sensor volume of several detector pixels 140 in a first group 141 of detector pixels by using a guard ring on the bottom of the sensor 20 in these constricted detector pixels 140. This guard ring is connected to a defined electrical potential by a dedicated electrical connection through the pixel electronics so that the electrical drift field in the sensor 20 of these constricted detector pixels 140 is limited compared to the normal detector pixels 3. The dimensions of the guard ring are adapted to the necessary sensitive area of the detector pixels 140. In a second group 142 of detector pixels 3, the pixels have a non-constricted sensor volume, and are adapted for measuring the lower dose rates.

Usage in a Dosemeter and kVp-Meter (FIGS. 14-18)

In a special embodiment of this invention the detector 1 can be used in one single apparatus to measure both, the dose and the acceleration voltage of an X-ray tube as a function of time.

To measure the tube voltage as a function of time, only the data delivered from a small number of detector pixels 3 is needed due to the fact that the flux of photons is high during an X-ray shot. A small sensitive area is sufficient to obtain the needed statistical significance in the determination of the maximum photon energy. In order to get the needed time resolution of about 1 msec, only the event counters 82 of a subset of the detector pixels 3 in the detector pixel array 3 is read out.

For example only a small number of columns is read out. For example the columns (155) and (156) are read out in an alternating way to get a continuous measurement of the energy deposition spectrum. The maximum energy deposition found in the energy deposition spectrum corresponds to the voltage of the X-ray tube.

The detector pixels 3 of column (155) are activated for the detection of events. As described above the energy deposition spectrum is measured using the digital discrimination method in the event counters 82 of the detector pixels 3 in column (155). The counting of events in the event counters 82 of column (155) is stopped at the end of the measuring phase. The numbers of counts in the event counters 82 of column (155) are transferred to the readout unit 4. The numbers of counts are then transferred to the microcontroller (186).

The microcontroller (186) determines the maximum energy in the energy deposition spectrum: it determines the highest energy interval showing a non-zero number of counts.

It is then possible to adapt the digital thresholds associated with the event counters 82 of column (155) in order to obtain a finer sampling and higher accuracy of the determined maximum energy.

During the transfer of the counter values of the event counters 82 of column (155) to the readout unit 4 and to the microcontroller (186) the detector pixels 3 of column (156) are active and count the number of events in energy deposition intervals defined by the digital thresholds of its event counting units 52. The counting of events in the event counters 82 of column (156) is suppressed during readout of column (156). At the same time the event counters 82 in column (155) start counting again. The data from column (156) are readout like the data of column (155) before and they are analyzed by the microcontroller (186).

If the detector pixels (140) with smaller sensitive area are used in columns (155) and (156) a sampling of the energy deposition spectrum at even higher fluxes can be obtained.

It is also possible to place absorbers in front of the columns (155) and (156) in order to reduce the flux. The maximum energy deposition and thus the determined value of the tube voltage are not affected by this.

It is also possible to use four columns (160) (161) (162) (163), where in front of the columns (160) and (161) one absorber (165) is placed and where in front of the columns (162) and (163) another absorber (166) is placed. The absorbers (165) and (166) differ in their material composition or in their thickness. Each absorber modifies the transmitting spectrum in a characteristic way. It is then possible to compare the energy deposition spectra measured in the event counters 82 in column (160) and (161) with the energy deposition spectra measured in the event counters 82 in column (162) and (163). So the measuring range concerning the maximum particle energy can be extended to higher particle energies.

The columns (160) and (161) are counting the number of events in an alternating way. The columns (162) and (163) are counting the number of events in an alternating way. The event counters 82 in column (160) are counting when the event counters 82 in column (162) are counting. The event counters 82 in column (161) are counting when the event counters 82 in column (163) are counting. In each moment, the event counters 82 in two columns are counting. In each moment, the event counters 82 in two columns are transferred to the readout unit 4 or the microcontroller (186). Thus, a dead time free measurement is obtained.

Figure 14:
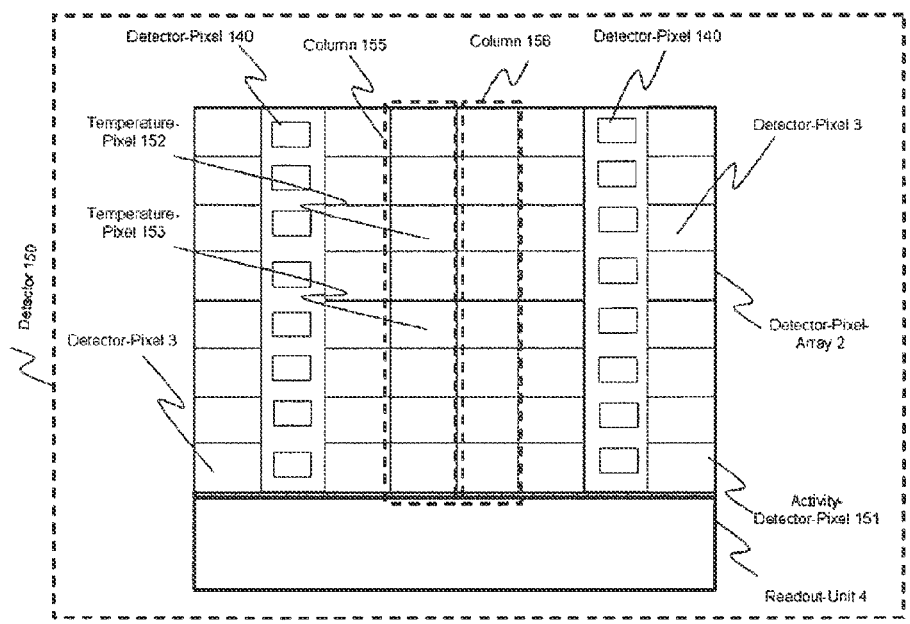
FIG. 14 is a schematic of a special embodiment of a detector-absorber combination to be used in a dosimeter or kVp-meter with a high upper limit of the measuring range concerning the dose rate and with the ability to perform a dead-time free measurement of the acceleration voltage of an X-ray tube.
Figure 15:
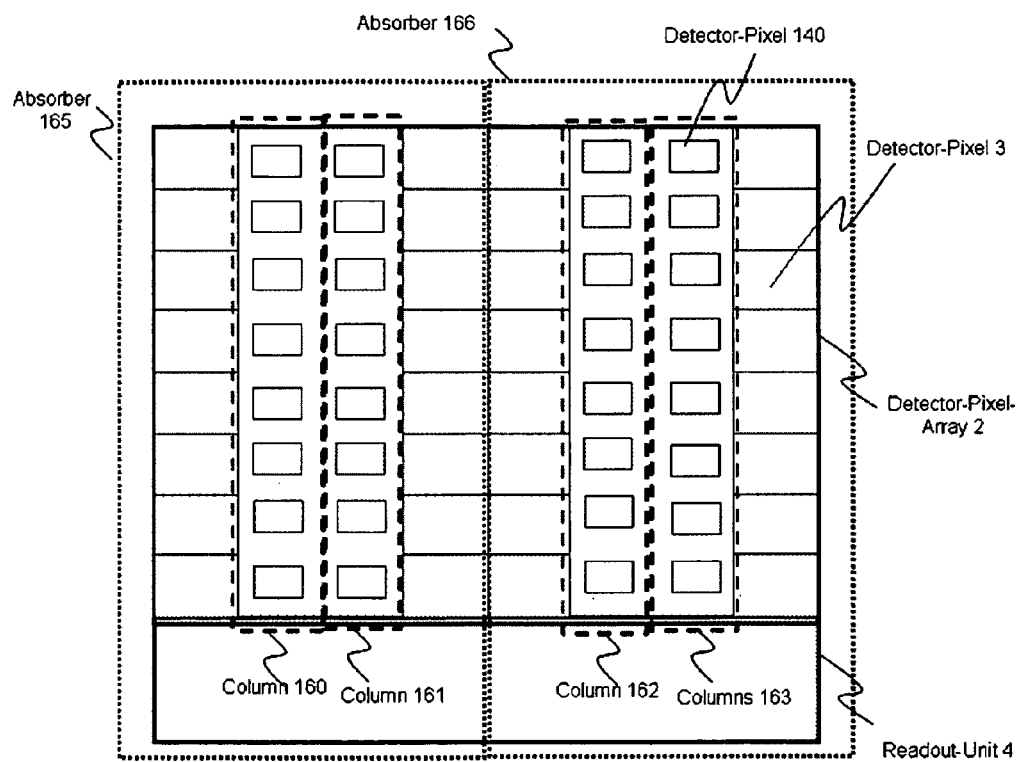
FIG. 15 is a schematic of a special embodiment of a detector to be used in a dosimeter or kVp-meter with a high upper limit of the measuring range concerning the dose rate and with a high upper limit of the measuring range concerning the particle energy and with the ability to perform a dead-time free measurement of the acceleration voltage of an X-ray tube.
Figure 16:
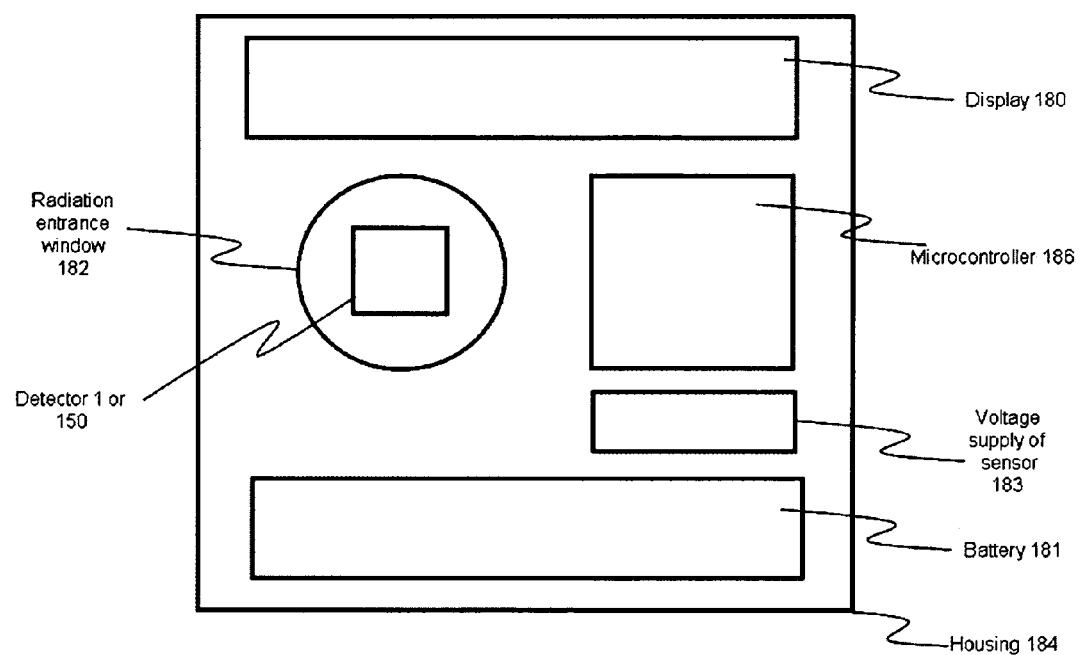
FIG. 16 illustrates a dosimeter using a radiation detector according to the invention.
Figure 17:
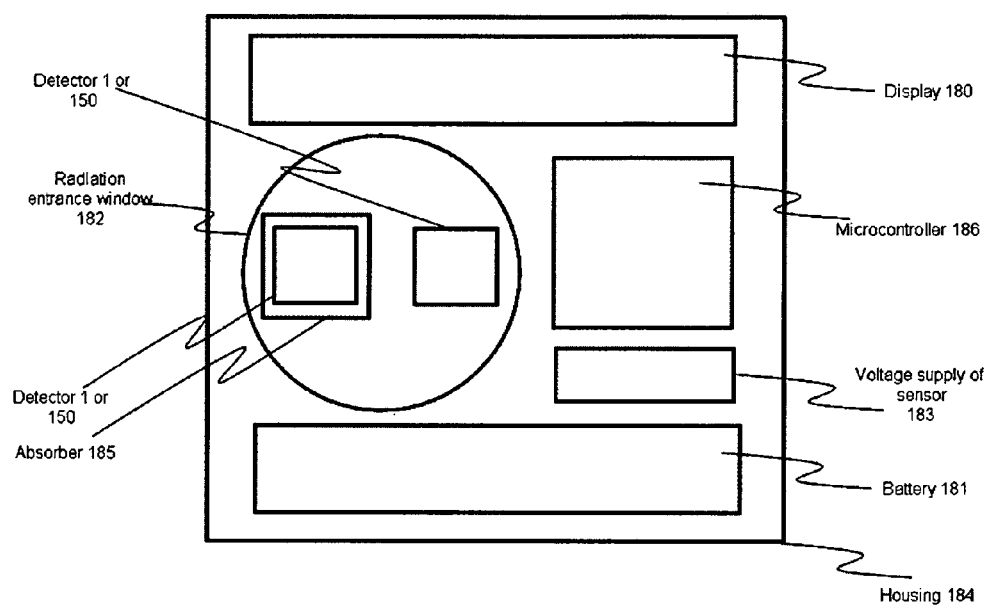
FIG. 17 illustrates another dosimeter using two radiation detectors according to the invention where an absorber is placed above one of the detectors.
Figure 18:
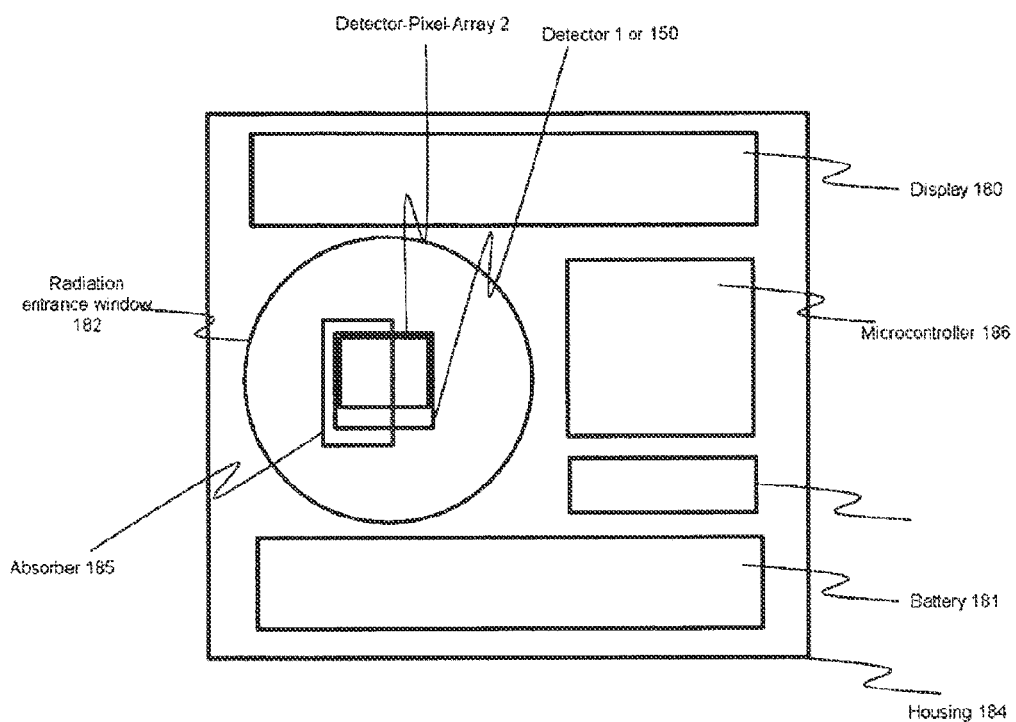
FIG. 18 illustrates still another dosimeter using a radiation detector according to the invention where an absorber is placed above a part of the detector pixels of the radiation detector.

Temperature Monitor (FIG. 14)

Changes in the environmental temperature or intense electrical activity in the detector 1 modify the temperature in the detector pixel array 2. This results in changes of the thresholds of the discriminators 63, changes in the correction voltages in the correction units (64) or in changes of the properties of the analog processing units 62. In order to correct the display of the measured dose values in the microcontroller (186), it is reasonable to measure a temperature dependent signal.

It is reasonable to use a temperature sensor in the detector pixel array 2, due to the fact that the temperature in the detector pixel array 2 is the relevant temperature to be corrected for.

The signal to be used for temperature monitoring can be a characteristic current or voltage taken from the analog processing unit 62 or the discriminator 63 in at least one detector pixel (152). Before the measurement the dependency of the uncorrected determined dose values onto the strength of this temperature signal is measured and stored in the microcontroller (186). The microcontroller (186) modifies the displayed dose values according to this dependency.

It is also possible to supply at least one detector pixel (153) constantly with norm signals via the signal connection (61) or (67). The numbers of counts in the counters in this detector pixel (153) are the temperature signal. Before the measurement the dependency of the determined dose values onto the strength of this temperature signal is measured. The microcontroller (186) analyzes the data in the event counters 82 or time counters 70 of detector pixel (153) and determines necessary corrections to the displayed dose values. If the event counters 82 are used, a fine spacing of the digital thresholds around the expected value of the time counter value for the norm pulse is given to the event counting unit 52. Before the measurement the dependency of the uncorrected determined dose values on the counter values of detector pixel (153) is measured and stored in the microcontroller (186)

Methods of Determining the Dose or the Energy Spectrum of Incident Radiation

The energy deposition spectrum Ni measured with the whole detector pixel array 2 is calculated by summing the number of events counted in the above described energy intervals of all mmax detector pixels 3 having the same energy intervals given to their event counting units 52:

$$N_i = \sum_{m=1}^{m_{max}} (N_{Pixeldeposition})_i^m$$

Here we assume that $E^m_i = E^{m+1}_i$ for all i and all detector pixels 3 $m$ whose $(N_{Pixeldeposition})^m_i$ contribute to these sums. Therefore we define $E_i := E^m_i$ for all i and all m.

$N_i$ as a series in i is the total measured energy deposition spectrum in a discrete form. $N_i$ is the number of counted events with energy deposition in the interval $[E_i; E_{i+1}]$.

The energy deposition spectrum of monoenergetic irradiation of the energy $E_j^{mono}$ shall be labeled as $M_{ij}$. $M_{ij}$ is a series in i. The energy deposition spectrum $M_{ij}$ is normalized through a division by the number of particles used in the simulation or the measurement under monoenergetic irradiation. The index i describes the position in the energy deposition spectrum. The index j is an index of the primary energy $E_j^{mono}$. $M_{ij}$ is the probability that an incident particle of energy $E_j^{mono}$ leads to a count of an event in the energy deposition interval $[E_i; E_{i+1}]$. If there are $i_{max}$ intervals of the energy deposition, there should be at minimum the same number of different energy deposition spectra be measured or simulated, whereas preferably for each interval there is at minimum one primary energy $E_j^{mono}$ lying in the interval. There are $j_{max}$ deposition spectra measured or simulated. If $i_{max} = j_{max}$, the primary energy $E_i^{mono}$ can be chosen as $(E_{i+1} + E_i)/2$ for all i. $E_i^{mono}$ can also be chosen as the weighted mean value of the expected energy distribution of the incident radiation in the interval $[E_i; E_{i+1}]$ with the detection efficiency in this interval. The measured energy deposition spectrum $N_i$ of the radiation whose properties are to be determined with the apparatus can be written as:

$$N_i = \sum_{j=1}^{j_{max}} M_{ij} \cdot \tilde{N}_j$$

The series $\tilde{N}_j$ is an approximation of the energy spectrum of the incident particle energies. This means that $\tilde{N}_j$ is the number of particles that impinged with an energy close to $E_j^{mono}$ onto the sensor. The detection efficiency is already included in $M_{ij}$ through the determination of $M_{ij}$ and therefore $\tilde{N}_j$ is already corrected for eventually incomplete detection efficiency. $N_i$ as a series in i and $\tilde{N}_j$ as a series in j can be seen as components of a vector $\vec{N}$ and $\vec{\tilde{N}}$ respectively and the $M_{ij}$ are seen as components of a matrix $\hat{M}$. It can be written: $\vec{N} = \hat{M} \cdot \vec{\tilde{N}}$. The vector $\vec{\tilde{N}}$ is the energy spectrum of the incident radiation in its discrete form and can be calculated through a matrix inversion or through estimation methods like the Maximum-Likelihood Method. So the energy spectrum of the incident radiation is determined. The influences of charge sharing effect on the determined energy spectrum is corrected with the use of this reconstruction algorithm.

Another method to reconstruct the incident energy spectrum is to multiply first the number of counts in the highest bin j of the deposition spectrum with the normalized response function of the corresponding energy $E_j^{mono}$. The response function of an energy in the bin j contributes to the energy spectrum to be determined with the number of counts in bin j. The value of the multiplied response function of $E_j^{mono}$ in a bin i is then subtracted from the number of counts in bin i. This subtraction is carried out for all i<j. Thus, after the subtraction, the counts in bin (j−1) coming from particles of an energy of higher bins are eliminated. The response function onto the energy of the bin (j−1) contributes then with the result of the subtraction in this bin (j−1). The response function on the energy of bin (j−1) is then multiplied with the result of this subtraction. The value of this multiplied response function is subtracted from the already corrected counts in all bins i<(j−1) resulting in the contribution of the energy $E_{j-2}^{mono}$. This procedure is carried out successively again and again. In each step of this process, the remaining number of counts in the bins decreases. In the end, the contributions of all response functions to the measured energy deposition spectrum and therefore the energy spectrum is determined.

The dose D, deposited in a material like for example air or tissue, can be calculated from the determined spectrum $\tilde{N}_j$ of the incident particle energies if factors $K_j$ are determined prior by measurements or simulations. The factors can be determined using the energies $E_j^{mono}$ in simulations or measurements. The dose is the sum of the dose contributions of the energy intervals in the calculated energy spectrum:

$$D = \sum_{i=1}^{i_{max}} K_i \cdot \tilde{N}_i$$

Dose rate values can be determined through a division by the measuring time, which has to be determined by the dosemeter.

It also possible to directly determine dose values without prior determination of the deposition spectrum. In this method, the number of counts in each bin of the deposition spectrum $N_i$ is multiplied by a factor $L_i$. The factors $L_i$ are determined prior to the measurement through simulations or calibration measurements. The dose to be displayed is calculated by $$D = \sum_{i=1}^{i_{max}} L_i \cdot N_i$$

This method gives an estimation of the dose value.

The $L_i$ are determined by the following procedure. The dosemeter is irradiated in a simulation model or in a measurement to several spectra (calibration radiation) with known doses $D_j$. The number of counts $N_{ji}$ of the detector 1 in energy intervals i is measured for each spectrum j. The coupled-set of equations $$D_j = \sum_{i=1}^{i_{max}} L_i \cdot N_{ji}$$

can be written in matrix notation $$\vec{D} = \hat{N} \cdot \vec{L}.$$

The best estimation for the $L_i$ is obtained applying a pseudo-inverse Matrix onto the measured or simulated doses of the calibration radiation:

$$\vec{L} = [(\hat{N}^T \hat{N})^{-1} \cdot \hat{N}^T] \cdot \vec{D}$$

The information in the deposition spectrum, for example the maximum particle energy, can be used to determine some factors $\tilde{L}_j$ being more exact from the $L_j$. The dose would then be $$D = \sum_{j=1}^{j_{max}} \tilde{L}_j \cdot N_j.$$

The invention claimed is:

1. A radiation detector for measuring one or more characteristics of a radiation, comprising an array of detector pixels, a clock pulse generator, the array of detector pixels comprising at least a first detector pixel and a second detector pixel, the first detector pixel and the second detector pixel separately comprising:
   a sensor producing an electrical signal in response to an event of a photon or charged particle of said radiation impinging on said sensor;
   pixel electronics configured to receive and process said electrical signal, the pixel electronics comprising:
      an analog processing unit for amplifying and shaping said electrical signal and producing a shaped pulse,
      a time determination unit for counting a TOT-count, the TOT-count being the number of clock pulses occurring during the time interval when said shaped pulse is above a threshold, and
      a plurality of event counters, individual ones of the plurality of the event counters configured to count a number of events having a TOT-count in different predefined ranges, the predefined ranges being defined by digital energy thresholds;
wherein the predefined ranges of the individual event counters of the first detector pixel differ at least in part from the predefined ranges of the individual event counters of the second detector pixel;
wherein the radiation detector further comprises a copy unit, said copy unit comprising means for receiving a TOT-count value, a set of output ports copying said TOT-count value, a set of comparing units, each comparing unit comprising a set of TOT-count limit values, defining a set of TOT-count ranges, and being associated with an event counter, and comprising means for detecting when a measured TOT-count is within or above a range, and means for incrementing an event counter when a measured TOT-count is within or above said associated range.

2. The radiation detector according to claim 1, wherein the pixel electronics comprises means for receiving a normalized electrical signal at the input of said analog processing unit for calibrating said detector pixel.

3. The radiation detector according to claim 1, wherein the pixel electronics comprises means for receiving a normalized shaped pulse at the output of said analog processing unit for calibrating said detector pixel.

4. The radiation detector according to claim 1, wherein the array comprises columns of detector pixels, a readout unit, and means for transferring the counts accumulated in a column to said readout unit while counting in said column only is disabled, each column being transferred successively.

5. The radiation detector according to claim 1, wherein the radiation detector further comprises means for transferring said TOT-counts of said detector pixels of said array in a readout unit, means for grouping pixels having a non-zero TOT-count value in islands; and means for summing the deposited dose in each of the detector pixels of an island for obtaining the energy of a photon or charged particle of said radiation producing said island.

6. The radiation detector according to claim 5, wherein the radiation detector further comprises a microcontroller configured to determine the dose and/or the dose rate of said impinging radiation.

7. The radiation detector according to claim 5, wherein the radiation detector further comprises a microcontroller configured to determine the spectrum of said impinging radiation, and/or to determine the radioisotope or radioisotopes producing said radiation.

8. The radiation detector according to claim 1, wherein the radiation detector comprises a first group of detector pixels having a first sensitive area, and a second group of detector pixels having a second sensitive area, the first sensitive area being larger than the second sensitive area, whereby the first group measure radiation at low dose rates, and the second group measure radiation at high dose rates.

9. The radiation detector according to claim 8, wherein the first group comprises pixels having a pixel electrode for collecting said electrical pulse, a guard electrode being adjacent to said pixel electrode and connected to a fixed potential, whereby the sensitive volume of said sensor is restricted.

10. The radiation detector according to claim 1, wherein the radiation detector further comprises a switching unit, said switching unit comprising a set of TOT-count limit values, defining a set of TOT-count ranges, each TOT-count range being associated with an event counter, a detecting device configured to detect when a measured TOT-count is within or above a range, and an incrementing device configured to increment the event counter when a measured TOT-count is within or above associated range.

11. A radiation detector for measuring one or more characteristics of a radiation, comprising an array of detector pixels, a clock pulse generator, the array of detector pixels comprising at least a first detector pixel and a second detector pixel, the first detector pixel and the second detector pixel separately comprising:
   a sensor producing an electrical signal in response to an event of a photon or charged particle of said radiation impinging on said sensor;
   pixel electronics configured to receive and process said electrical signal, the pixel electronics comprising:
      an analog processing unit for amplifying and shaping said electrical signal and producing a shaped pulse, a time determination unit for counting a TOT-count, the TOT-count being the number of clock pulses occurring during the time interval when said shaped pulse is above a threshold, and a plurality of event counters, individual ones of the plurality of the event counters configured to count a number of events having a TOT-count in different predefined ranges, the predefined ranges being defined by digital energy thresholds;

wherein the predefined ranges of the individual event counters of the first detector pixel differ at least in part from the predefined ranges of the individual event counters of the second detector pixel;

wherein the radiation detector further comprises a copy unit, said copy unit comprising a receiving device configured to receive a TOT-count value, a set of output ports copying said TOT-count value, a set of comparing units, each comparing unit comprising a set of TOT-count limit values, defining a set of TOT-count ranges, and being associated with an event counter, and comprising a detecting device configured to detect when a measured TOT-count is within or above a range, and an incrementing device configured to increment an event counter when a measured TOT-count is within or above associated range.

12. The radiation detector according to claim 1, wherein the pixel electronics comprises a receiving device configured to receive a normalized electrical signal at the input of said analog processing unit for calibrating said detector pixel.

13. The radiation detector according to claim 1, wherein the pixel electronics comprises a receiving device configured to receive a normalized shaped pulse at the output of said analog processing unit for calibrating said detector pixel.

14. The radiation detector according to claim 1, wherein the array comprises columns of detector pixels, a readout unit, and a transfer device configured to transfer the counts accumulated in a column to said readout unit while counting in said column only is disabled, each column being transferred successively.

15. The radiation detector according to claim 1, wherein the radiation detector further comprises a transfer device configured to transfer the TOT-counts of said detector pixels of said array in a readout unit, a grouping device configured to group pixels having a non-zero TOT-count value in islands; and a summing device configured to sum the deposited dose in each of the detector pixels of an island for obtaining the energy of a photon or charged particle of said radiation producing said island.

16. The irradiation detector according to claim 1, further comprising wherein a microcontroller is configured to operate in a power-saving mode and periodically wake up to read outputs from the event counters.

17. The radiation detector according to claim 1, wherein the predefined ranges of the individual event counters of the first detector pixel and the predefined ranges of the individual event counters of the second detector pixel include energy level thresholds between 10 keV and 160 keV.

* * * * *